United States Patent
Vorenkamp (10) Patent No.: US 7,102,424 B2
(45) Date of Patent: *Sep. 5, 2006

(54) REFERENCE LADDER HAVING IMPROVED FEEDBACK STABILITY

(75) Inventor: Pieter Vorenkamp, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/056,198

(22) Filed: Feb. 14, 2005

(65) Prior Publication Data

US 2005/0134363 A1    Jun. 23, 2005

Related U.S. Application Data

(63) Continuation of application No. 10/283,088, filed on Oct. 30, 2002, now Pat. No. 6,885,236.

(60) Provisional application No. 60/388,311, filed on Jun. 14, 2002.

(51) Int. Cl.
H03M 1/78    (2006.01)
H03M 1/34    (2006.01)
G05F 1/46    (2006.01)

(52) U.S. Cl. ........................ 327/540; 327/104; 341/154

(58) Field of Classification Search ................ 327/104, 327/538, 540; 341/154, 155
See application file for complete search history.

(56) References Cited

U.S. PATENT DOCUMENTS 4,496,935 A    1/1985    Inoue et al. ................. 341/118

(Continued)

FOREIGN PATENT DOCUMENTS

EP    0741460 A2    11/1996

OTHER PUBLICATIONS

European Search Report Issued Apr. 11, 2005 for Appln. No. EP 03013658, 3 pages.

(Continued)

*Primary Examiner*—Terry D. Cunningham
*Assistant Examiner*—Terry L. Englund
(74) *Attorney, Agent, or Firm*—Sterne, Kessler, Goldstein & Fox P.L.L.C.

(57) ABSTRACT

A reference ladder is configured to have improved feedback stability. The reference ladder includes a resistor ladder having a plurality of taps that produce a plurality of reference voltages. The resistor ladder is driven by a first current source at a first tap of the plurality of taps and by a second current source at a second tap of the plurality of taps. A first feedback network senses a voltage at the first tap and controls the first current source based on the first sensed voltage. A second feedback network senses a voltage at the second tap and controls the second current source based on the second sensed voltage. The first and second taps each operate as both a force tap and a sense tap of the resistor ladder. Differential input stages that are connected to the plurality of taps are at least partially isolated from the feedback networks by converging the force and sense taps, thereby improving the stability of the feedback networks. An alternate embodiment includes first and second resistor ladders that are configured to generate substantially identical voltages across their respective taps. First and second feedback networks sense voltages on the first resistor ladder and control current sources that drive both the first resistor ladder and the second resistor ladder. Differential input stages that are connected to the taps of the second resistor ladder and are at least partially isolated from the feedback networks that are connected to the first resistor ladder, thereby improving stability of the feedback networks.

13 Claims, 4 Drawing Sheets

U.S. PATENT DOCUMENTS

| | | | |
|---|---|---|---|
| 5,367,202 A | 11/1994 | Yee | 327/540 |
| 5,376,937 A * | 12/1994 | Colleran et al. | 341/159 |
| 5,828,329 A | 10/1998 | Burns | 341/155 |
| 6,384,763 B1 * | 5/2002 | Leung et al. | 341/154 |
| 6,518,898 B1 | 2/2003 | Choksi | 341/118 |
| 2003/0043066 A1 | 3/2003 | Otsuka et al. | 341/158 |
| 2003/0071666 A1 | 4/2003 | Bailey | 327/131 |

OTHER PUBLICATIONS

Patent Abstracts of Japan, Publication No. 59148466, Aug. 25, 1984.

Patent Abstracts of Japan, Publication No. 02050523, Feb. 20, 1990, vol. 0082, No. 081.

* cited by examiner

FIG. 1

(Conventional)

FIG. 4
(Conventional)

REFERENCE LADDER HAVING IMPROVED FEEDBACK STABILITY

This application is a continuation of U.S. patent application Ser. No. 10/283,088, filed on Oct. 30, 2002, issued as U.S. Pat. No. 6,885,236 on Apr. 26, 2005, which claims the benefit of U.S. Provisional Application No. 60/388,311, filed Jun. 14, 2002, both of which are incorporated by reference herein in their entirety.

BACKGROUND OF THE INVENTION

1. Field of the Invention

The present invention generally relates to a reference ladder having improved feedback stability that can provide reference voltages for an analog-to-digital converters (ADC), and other types of circuits that utilize reference voltages.

2. Background Art

Analog-to-digital converters (ADCs) convert analog signals into a digital format for further efficient processing using digital circuits and/or processors. As digital control and processing are applied to more numerous applications, the demand for ADCs continues to increase. Furthermore, there is an increasing demand for ADCs that are inexpensive and that provide high performance.

A conventional ADC often includes a voltage reference ladder (also called a reference ladder) having a resistor ladder with a plurality of taps. Each tap provides a reference voltage that is utilized by the ADC to quantize the incoming analog signal. More specifically, a bank of ADC comparators (or differential input stages) compares the reference voltages from the reference ladder to the analog signal in order to quantize the analog signal and generate a digital output signal.

The accuracy of the analog-to-digital conversion is heavily dependent on the accuracy of the reference voltages from the reference ladder. More specifically, the ADC full scale range is controlled by these voltages. Accordingly, a feedback network is utilized to maintain the accuracy of the reference voltages. The feedback network utilizes certain taps of the reference ladder known conventionally as "sense" points or taps, and "force" points (or taps). A voltage or current source is applied at the force taps to control the reference voltages that are produced by the reference ladder. The force taps are usually the first and last taps on the reference ladder. The sense taps are certain taps on the reference ladder that are monitored (or sensed) to check if the desired reference voltages are being produced by the reference ladder. More specifically, an operational amplifier (op amp) compares the voltage across the sense taps with a desired reference voltage (e.g. ADC full scale voltage), and adjusts the voltage or current source at the force taps to produce the desired voltage across the sense taps.

A bank of ADC comparators are connected to the taps of the reference ladder and receive the reference voltages. The ADC comparators have associated circuit parasitics that load the sense taps. As a result, the parasitics of the ADC comparators effect the voltage and current at the sense taps, and effectively load the feedback control loop that drives the force taps of the reference ladder. Furthermore, since the sense taps are taken across a subset of the plurality of taps, a portion of the reference ladder resistance is also in the feedback control loop. Both the circuit parasitics and the reference ladder resistance contribute to de-stabilization of the feedback control loop.

Accordingly, it is desirable to configure the reference ladder so as to prevent the ADC comparators and the ladder resistance from loading the feedback control loop, so as to improve the loop stability.

BRIEF SUMMARY OF THE INVENTION

The present invention is a voltage reference ladder that has improved feedback stability. The voltage reference ladder includes a resistor ladder having a plurality of taps to produce a plurality of output voltages that can be used as reference voltages by an ADC, or another type of circuit. The resistor ladder is driven by a first current source at a first tap of the plurality of taps and by a second current source at a second tap of the plurality of taps. A first feedback network senses a voltage at the first tap and controls the first current source based on the first sensed voltage. A second feedback network senses a voltage at the second tap and controls the second current source based on the second sensed voltage. The first and second taps are at opposite ends of the resistor ladder. Furthermore, the first and second taps each operate as both a force tap and a sense tap of the resistor ladder. This occurs because the first and second taps are connected to the outputs of their respective current sources, and are also sensed by their respective feedback networks.

The first feedback network includes a first op amp having a first input connected to the first tap and an output controlling the first current source. The second feedback network includes a second op amp having a first input connected to the second tap and an output controlling the second current source. The reference voltage is applied across a second input of the first op amp and a second input of the second op amp, and is determined by scaling-up the ADC full scale range from Vref to Vref'.

A plurality of differential input stages can be connected to corresponding taps of the resistor ladder to receive the plurality of output voltages from the reference ladder. The differential input stages are at least partially isolated from the first feedback network and the second feedback network, thereby improving stability of the first feedback network and the second feedback network when compared to conventional configurations.

In another embodiment, the resistor ladder includes a first resistor ladder and a second resistor ladder, each having a plurality of taps. The first resistor ladder is driven by a first current source and a second current source at respective force taps that are located at opposite ends of the first resistor ladder. A second resistor ladder is driven by a third current source and a fourth current source at respective force taps that are located at opposite ends of the second resistor ladder. The first and second resistor ladders are configured to generate substantially identical output voltages across their respective taps.

A first feedback network senses a voltage at a first sense tap of the first resistor ladder, and controls both the first current source and the third current source based on the sensed voltage. A second feedback network senses a voltage at a second sense tap of the first resistor ladder, and controls both the second current source and the fourth current source based on the voltage that is sensed at the second sense tap. As such, the first and second feedback networks control the respective current sources of both of the first and second resistor ladders, but only sense voltage from the first resistor ladder.

A plurality of differential input stages, corresponding to the taps of second resistor ladder, receive the plurality of voltages from the second resistor ladder. The plurality of differential input stages are at least partially isolated from the feedback networks because the sense taps for the feedback networks are taken from the first resistor ladder, and not the second resistor ladder.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Conventional ADC

Figure 1:
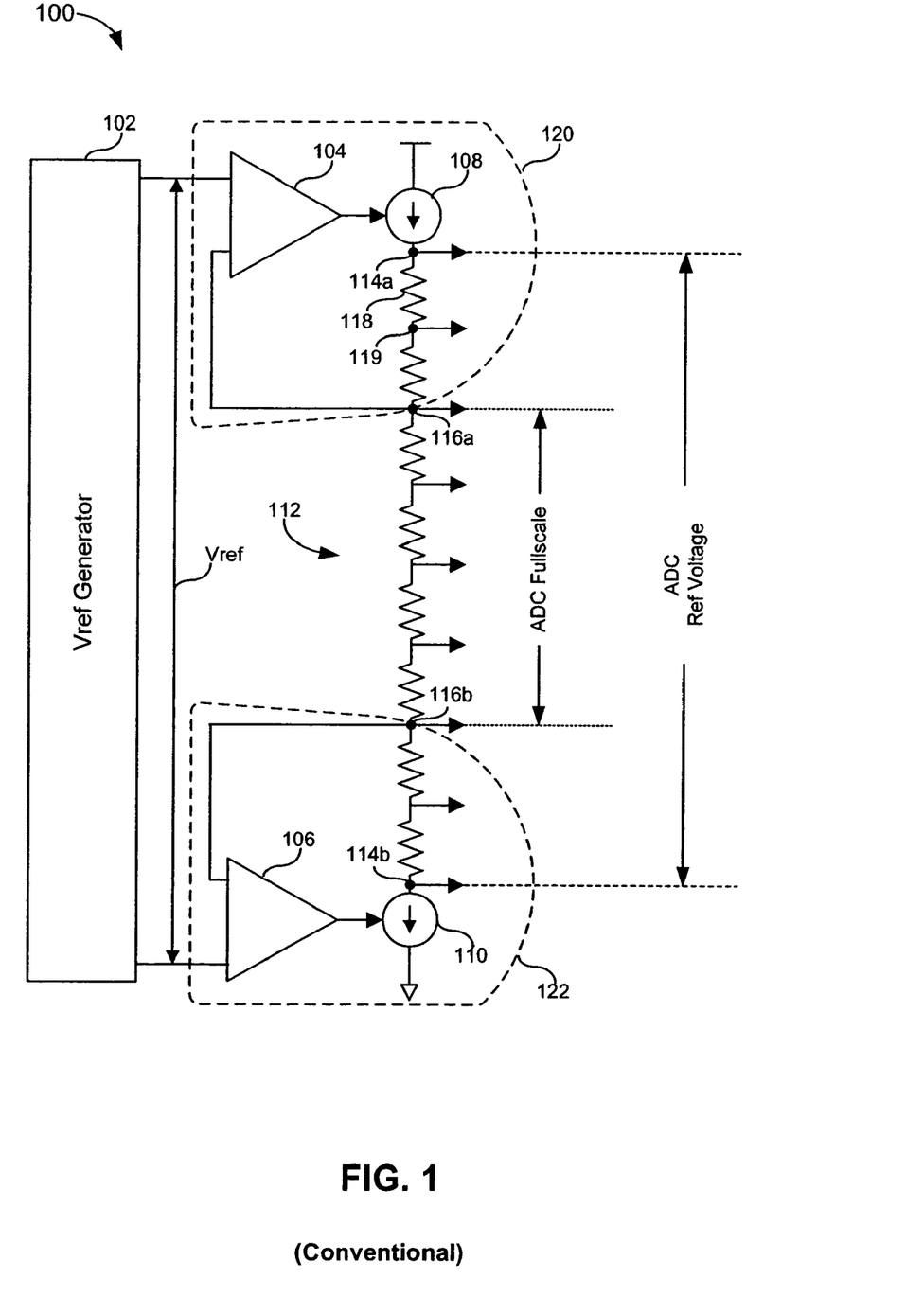
FIG. 1 illustrates a conventional reference ladder for an analog-to-digital converter.

The conventional reference ladder 100 includes a reference generator 102 that generates a voltage reference $V_{ref}$, Op amps 104 and 106, and a resistor ladder 112. The resistor ladder 112 includes multiple resistors 118 that are series-connected, and taps 119 between the resistors 118. The resistor ladder 112 is driven by a current source 108 at the top, and by a current source 110 at the bottom of the resistor ladder 112. The taps 119 of the resistor ladder (between the resistors 118) provide the reference voltages for the ADC. In other words, the reference voltages are used by the ADC differential input stages to quantize the analog input. (See FIG. 4)

The first and last taps 114a and 114b are referred to as force taps, as this is where the current sources 108 and 110 drive the resistor ladder 112. The taps 116a and 116b are referred to as sense taps, as the sense taps are used to sense the voltage on the resistor ladder 112.

The op amp 104, the current source 108, and the sense point 116a form a feedback network 120. Likewise, the op amp 106, the current source 110, and the sense point 116b form a feedback network 122. The op amp 104 compares the voltage at the sense tap 116a to the voltage $V_{ref}$ produced by the voltage generator 102, and generates an output based on the difference. The output of the op amp 104 controls the current source 108. Likewise, the op amp 106 compares the voltage at the sense tap 116b to the voltage $V_{ref}$ produced by the voltage generator 102, and generates an output that controls the current source 110. In other words, the feedback networks 120 and 122 drive the current sources 108 and 110 to set a desired voltage between the sense taps 116a and 116b equal to $V_{ref}$.

The voltage $V_{ref}$ is set to the "ADC full scale range" so that the feedback networks 120, 122 drive the voltage across the sense taps 116 to this voltage. The "ADC full scale range" generally represents the voltage that the analog input signal is expected to fall within. Therefore, the taps 119 within the ADC full scale range should provide a sufficient number of reference voltages to quantize the analog input signal. However, additional reference voltages are required to insure linear operation of the ADC, especially at the edges of the "ADC full scale range". Furthermore, various ADC architectures, such as folding flash and folding interpolating ADCs, require additional reference voltages that are outside the ADC full scale range. Hence, there are additional resistors 118 outside the ADC full scale range to generate the additional reference voltages, namely the resistors 118 between the force points 114 and the sense points 116, which are also in the feedback networks 120 and 122.

The ADC full scale reference voltages can be identified as a first set of reference voltages, and the additional references voltages outside the ADC full scale range can be identified as a second set of reference voltages, to produce a the total voltage drop across the resistor ladder 112. The first set of reference voltages and the second additional set of reference voltages are delivered to the ADC differential input stages and are generally known as "ADC reference voltages", shown in FIG. 1.

Figure 4:
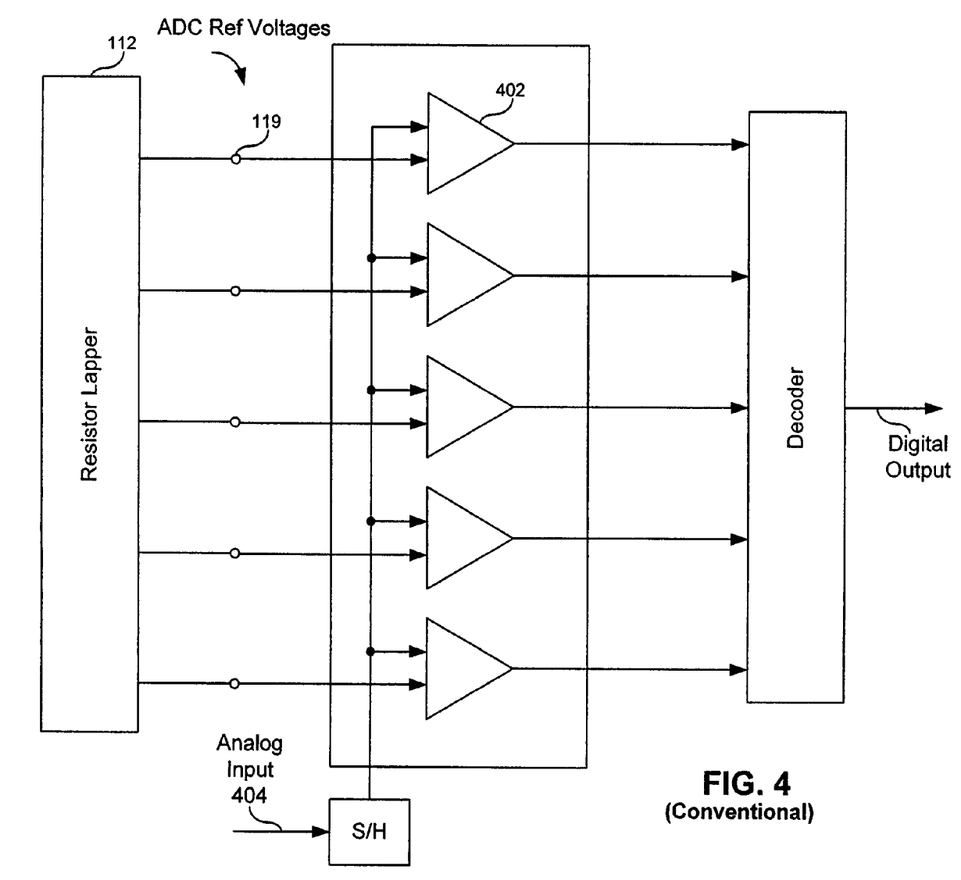
FIG. 4 illustrates external loading of a reference ladder.

The taps 119 are connected to differential input stages (e.g. comparators) that quantize an analog input signal. For example, FIG. 4 illustrates the taps 119 connected to a bank of differential input stages 402 that quantize an analog input signal 404 using the reference voltages from the reference ladder 100. The differential input stages 402 have parasitics associated with them. These parasitics load the feedback networks 120 and 122 via the taps 119 within the respective feedback networks, causing loop instability. Furthermore, the resistors 118 in the feedback networks 120 and 122 also load the feedback networks and cause instability.

Figure 2:
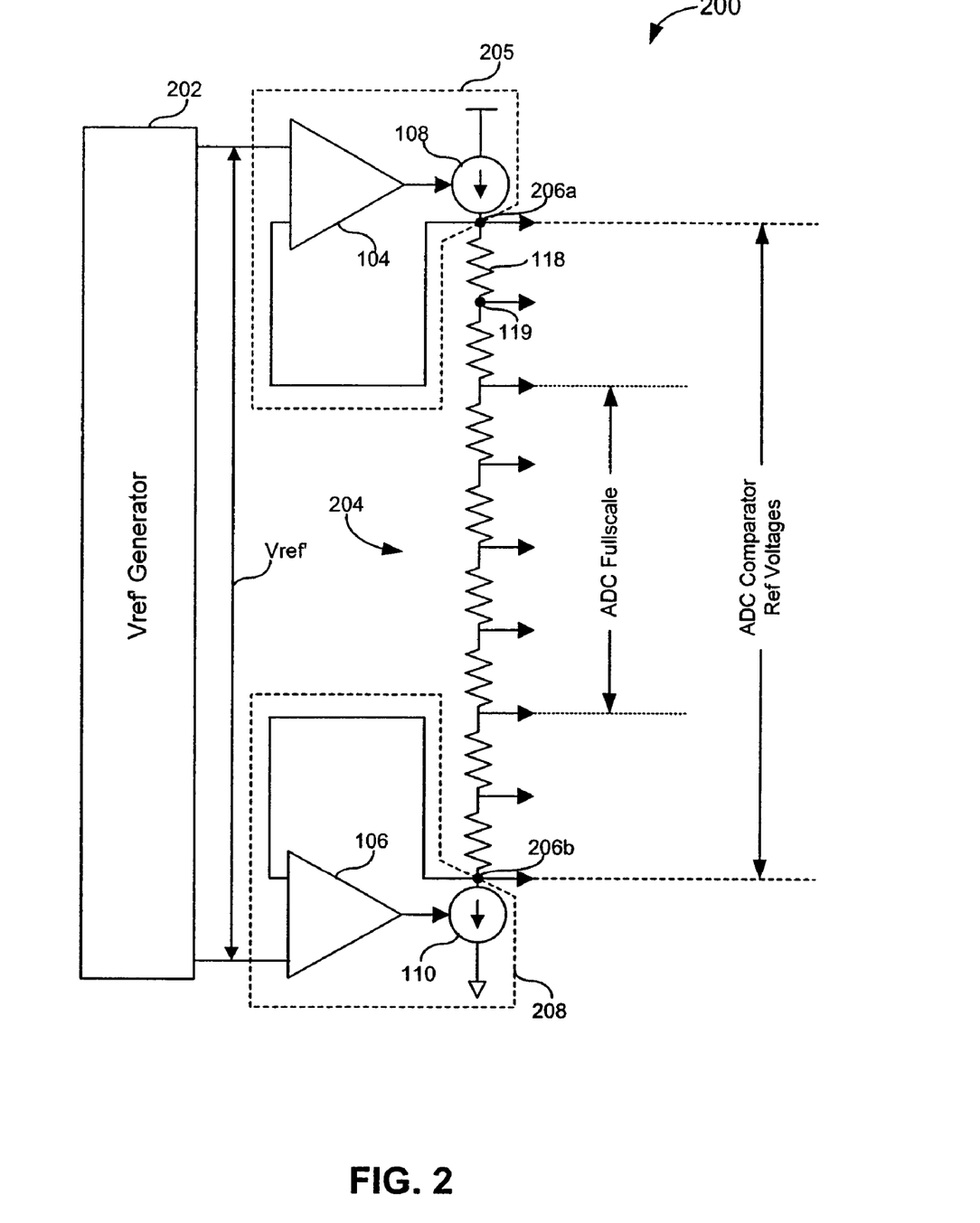
FIG. 2 illustrates a reference ladder according to embodiments of the present invention.

FIG. 2 illustrates a reference ladder 200 having improved feedback stability according to embodiments of the present invention. The reference ladder 200 includes a reference generator 202 that generates a voltage reference $V_{ref}'$, op amps 104 and 106, and a resistor ladder 204. The resistor ladder 204 includes multiple resistors 118 and taps (e.g. 119) between the resistors 118. The resistor ladder 204 is driven by the current source 108 at the top and by a current source 110 at the bottom of the resistor ladder 112. The taps of the resistor ladder (between the resistors 118) provide the reference voltages for the ADC. The "reference voltages" produced by the reference ladder 200 may also be called "output reference voltages" or more generally "output voltages".

The op amp 104, the current source 108, and the tap 206a form a feedback network 205. Likewise, the op amp 106, the current source 110, and the tap 206b form a feedback network 208. The op amp 104 compares the voltage at the tap 206a to the voltage $V_{ref}'$ produced by the voltage generator 202, and generates an output based on the difference. The output of the op amp 104 controls the current source 108. Likewise, the op amp 106 compares the voltage at the tap 206b to the voltage $V_{ref}'$ produced by the voltage generator 102, and generates an output that controls the current source 110. In other words, the feedback networks 205 and 208 drive the current sources 108 and 110 to set a desired voltage between the sense taps 206a and 206b equal to $V_{ref}'$. As will be apparent, the current sources 108 and 110 can be configured as voltage sources that produce the necessary current to generate the ADC reference voltages.

Based on the discussion above, the reference ladder 200 is similar to the reference ladder 100, except that the first tap 206a is connected to the input of the op amp 104, and the last tap 206b is connected to the input of the op amp 106. In other words, the taps 206a and 206b operate as both force taps and sense taps. Stated another way, the force taps and the sense taps are converged to a single pair of taps 206a and 206b. Whereas, in the conventional reference ladder 100, the force taps 114a and 114b are separate and distinct from the sense taps 116a and 116b.

As a result, the reference feedback networks 205 and 208 in the reference ladder 200 are not loaded by any of the resistors 118, or by the differential input stages connected to the taps 119. Therefore, the stability of the feedback networks 205 and 208 is improved.

Another result of converging the force/sense taps 206a and 206b is that the ADC full scale voltage is now a fraction of the voltage across the force/sense taps 206. Whereas, in the conventional reference ladder 100, the ADC full scale voltage is equal to voltage across the sense taps 116. Therefore, the voltage $V_{ref}'$ produced by the voltage generator 202 is a scaled-up version of the voltage $V_{ref}$ that is produce by the voltage generator 102, for a given ADC full scale range. More specifically, ratio of $V_{ref}'$ to $V_{ref}$ is scaled-up by an amount of:

$$V_{ref}'/V_{ref}=[\text{Reference voltages for ADC}]/[\text{ADC full scale voltage}];$$

where [Reference voltages for ADC]=the total voltage drop across the resistor ladder. The voltage $V_{ref}'$ is scaled-up to accommodate for the voltage drop across the resistors 118 that are between the force/sense taps 206 and the ADC full scale range, (namely, the first two resistors and the last two resistors in the voltage ladder 204). Whereas, in the reference ladder 100, this voltage drop was considered by the feedback network.

Figure 3:
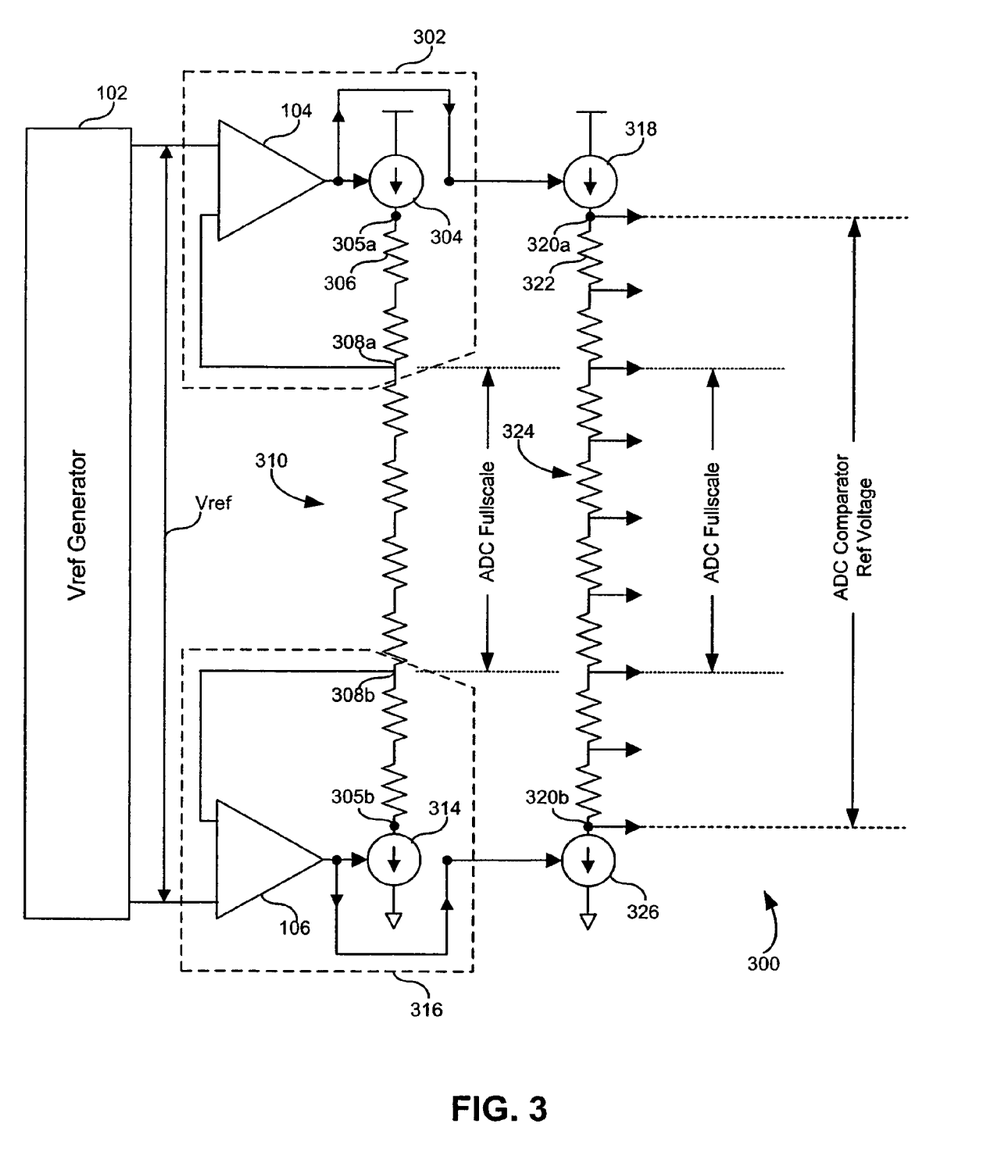
FIG. 3 illustrates a reference ladder configuration having a first and second resistor ladders according to embodiments of the present invention.

FIG. 3 illustrates another reference ladder 300 having improved loop stability according to embodiments of the invention. Reference ladder 300 includes two resistor ladders to separate the ADC op amps connected to the second resistor ladder from the feedback networks connected to the first resistor ladder. More specifically, reference ladder 300 includes a first resistor ladder 310 having a plurality of resistors 306 with multiple taps in between the resistors that includes sense taps 308a and 308b and force taps 305a and 305b. The sense taps 308a,b are fed back to the respective op amps 104 and 106 for comparison with $V_{ref}$ to form feedback networks 302 and 316. Based on the comparison with $V_{ref}$, the output of the op amp 104 controls a current source 304, and op amp 106 controls a current source 314. Similar to the discussion above, the op amps 104 and 106 control the current sources 304 and 314 so that the voltage across the sense taps 308a and 308b is equal to $V_{ref}$, which is set to the ADC full scale range.

The reference ladder 300 also includes a second resistor ladder 324 having a plurality of resistors 322 with multiple taps in between the resistors 322 that generate the ADC reference voltages. The second resistor ladder 324 is driven by current sources 318 and 326 at the respective force taps 320a and 320b. The second reference ladder does not have any sense taps, as the sensing operation is performed using the first reference ladder.

The second voltage ladder 324 is configured to produce approximately identical voltages at taps between the resistors 322, as that produced by the corresponding taps of the first voltage ladder 310. To do so, resistors 322 are selected to have values that are approximately the same as the corresponding resistors 306 in the first resistor ladder 310. Furthermore, the current source 318 is the same as the current source 304 and is commonly controlled by the output of the op amp 104. The current source 326 is the same as the current source 314 and is commonly controlled by the output of the op amp 106. Accordingly, the reference voltages produced by the reference ladder 324 should match those produced by the resistor ladder 310, where the voltages from the resistor ladder 324 drive the differential input stages in the ADC (e.g. differential input stages 402).

By using two resistor ladders, the differential input stages connected to the taps of the resistor ladder 324 are isolated from the feedback networks 302 and 316. Therefore, the parasitics associated with the ADC differential input stages do not load the feedback network 302 or the feedback network 316, which improves loop stability of these loops.

The reference ladder discussed herein has been illustrated as part of an ADC. This is done for example purposes only, and is not meant to limit the scope of the invention. The reference ladder can be used in other circuit applications besides ADCs, as will be understood by those skilled in the relevant arts.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A method of generating a plurality of reference voltages, comprising:
   generating a first plurality of reference voltages using a first current source;
   generating a second plurality of reference voltages using a second current source;
   sensing one of said first plurality of reference voltages;
   comparing said sensed one of said first plurality of reference voltages with an input reference voltage to generate a control signal; and
   controlling said first current source and said second current source based on said control signal from said comparing step; and
   outputting said second plurality of reference voltages for analog-to-digital conversion of an analog input signal.

2. The method of claim 1, further comprising:
   receiving said analog input signal; and
   converting said analog input signal to digital using said second plurality of reference voltages.

3. The method of claim 1, wherein said step of generating a first plurality of reference voltages includes the step of driving a first resistor ladder with said first current source that is controlled by said control signal.

4. The method of claim 3, wherein said step of generating a second plurality of reference voltages includes the step of driving a second resistor ladder with said second current source that is controlled by said control signal.

5. The method of claim 4, wherein said step of outputting said second plurality of reference voltages includes the step of outputting said second plurality of reference voltages to a corresponding plurality of differential input stages, said plurality of differential input stages isolated from said first resistor ladder.

6. An apparatus, comprising:
a first resistor ladder having a first plurality of taps and driven by a first variable current source;
a second resistor ladder having a second plurality of taps and driven by a second variable current source to provide a plurality of output reference voltages, wherein said second variable current source is controlled based on a voltage sensed at one of said first plurality of taps;
a feedback means for determining said sensed voltage of said first resistor ladder and for controlling said second variable current source based on said sensed voltage, wherein said feedback means compares said sensed voltage from said first resistor ladder with an input reference voltage; and
a plurality of differential input stages that receive said plurality of output reference voltages.

7. The apparatus of claim 6, wherein said plurality of differential input stages also receive an analog input signal that is digitized using said plurality of output reference voltages from said second reference ladder.

8. The apparatus of claim 6, wherein said feedback means also controls said first variable current source.

9. The apparatus of claim 6, wherein said feedback means is isolated from said differential input stages.

10. The apparatus of claim 6, wherein said first resistor ladder has resistor values that are substantially similar to corresponding ones of said second resistor ladder.

11. An apparatus, comprising:
a first resistor ladder having a first plurality of taps and driven by a first variable current source;
a second resistor ladder having a second plurality of taps and driven by a second variable current source to provide a plurality of output reference voltages, wherein said second variable current source is controlled based on a voltage sensed at one of said first plurality of taps; and
a feedback means for determining said sensed voltage of said first resistor ladder and for controlling said second variable current source based on said sensed voltage, said feedback means comparing said sensed voltage from said first resistor ladder with an input reference voltage;
wherein said plurality of output reference voltages are used to digitize an analog input signal.

12. The apparatus of claim 11, wherein said feedback means includes an operational amplifier having a first input coupled to said sensed voltage of said first resistor ladder, and a second input coupled to said input reference voltage, and an output coupled to said second variable current source.

13. The apparatus of claim 12, wherein said operational amplifier output is also coupled to said first variable current source.

* * * * *

UNITED STATES PATENT AND TRADEMARK OFFICE
CERTIFICATE OF CORRECTION

| | | |
|---|---|---|
| PATENT NO. | : 7,102,424 B2 | Page 1 of 1 |
| APPLICATION NO. | : 11/056198 | |
| DATED | : September 5, 2006 | |
| INVENTOR(S) | : Pieter Vorenkamp | |

It is certified that error appears in the above-identified patent and that said Letters Patent is hereby corrected as shown below:

Column 4
Line 26, please replace "from the reference" with --from the resistor ladder 112 of the reference--.

Line 56, please replace "generator 102" with --generator 202--.

Signed and Sealed this

Seventeenth Day of April, 2007

JON W. DUDAS
*Director of the United States Patent and Trademark Office*